United States Patent [19]

Capasso et al.

[11] Patent Number: 4,679,061
[45] Date of Patent: Jul. 7, 1987

[54] SUPERLATTICE PHOTOCONDUCTOR

[75] Inventors: Federico Capasso, Westfield; Alfred Y. Cho, Summit; Albert L. Hutchinson, Piscataway; Khalid Mohammed, North Plainfield, all of N.J.

[73] Assignee: American Telephone and Telegraph Company, AT&T Bell Laboratories, Murray Hill, N.J.

[21] Appl. No.: 745,277

[22] Filed: Jun. 14, 1985

[51] Int. Cl.⁴ .............................................. H01L 27/12
[52] U.S. Cl. ........................................ 357/4; 357/30
[58] Field of Search .............................. 357/4 SL, 30

[56] References Cited

U.S. PATENT DOCUMENTS 3,626,328 12/1971 Esaki .................................. 357/4 SL
4,163,238 7/1979 Esaki .................................. 357/4 SL Primary Examiner—Martin H. Edlow
Attorney, Agent, or Firm—Richard D. Laumann

[57] ABSTRACT

Photoconductive gain is observed in a device comprising a superlattice having well and barrier layers, and cladding layers on the opposite sides of the superlattice with the barrier layers of the superlattice having an energy bandgap greater than the bandgap of the cladding layers.

6 Claims, 6 Drawing Figures

4,679,061

SUPERLATTICE PHOTOCONDUCTOR

TECHNICAL FIELD

This invention related generally to field of photodetectors, and particularly to such photodetectors which rely upon photoconductivity for their sensitivity.

BACKGROUND OF THE INVENTION

In elementary terms, a photoconductor is a piece of semiconductor material to which two electrical contacts have been affixed. When light is absorbed by the semiconductor, carriers are generated and the conductivity of the semiconductor between the electrical contacts changes. As is well known, a large number of semiconductor materials exhibit photoconductivity and they have found commercial use as, for example, light meters.

As only a single electron-hole pair is produced by each absorbed photon, it is not immediately apparent that photoconductors can exhibit current gain. However, a detailed analysis shows that when the lifetime of the photogenerator carriers exceeds the transit time of the carriers in the semiconductor, current gain can be obtained. In fact, extremely large current gains, e.g., $10_6$, can be obtained. The gain, as well as the associated gain-bandwidth product, can be controlled, within materials limitations, by appropriate choice of semiconductor characteristics such as carrier mobilities and lifetimes.

While gain is a desirable characteristic of phtodetectors, not all types of photodetectors necessarily exhibit gain. For example, the wellknown p-n junction, which is commonly used in photodetectors, does not exhibit current gain.

SUMMARY OF THE INVENTION

We have found that a device comprising a superlattice having interleaved well and barrier layers, the barrier layers having a first bandgap, and first and second semiconductor layers disposed on opposite sides of the superlattice of which at least one layer is highly doped, is an efficient photodetector exhibiting gain and using photoconductivity as the primary detection mechanism. Current gain is obtained through the differential conductivity experienced by electrons and holes in the superlattice. If the first and second layers have first and second conductivity types, that is, the device has a p-n junction and is operated in a forward-biased mode, large photocurrent gains are also obtained.

DETAILED DESCRIPTION

Figure 1:
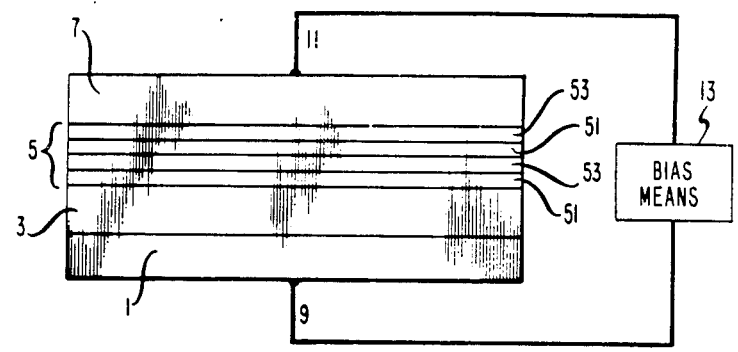
FIG. 1 is a view of an exemplary embodiment with this invention.

A sectional view of a device according to our invention is shown in FIG. 1. For reasons of clarity, the elements of the device are drawn to scale. The device depicted comprises substrate 1, first semiconductor layer 3, superlattice region 5, and second semiconductor layer 7. At least one of layers 3 and 7 is highly doped, i.e., the Fermi level is close to or within the conduction band. Substrate 1 and layer 7 are electrically contacted by contacts 9 and 11, respectively. Bias means 13 can apply an electric field perpendicular to the superlattice. The means are well known and need not be described in detail. The bias may be positive or negative. Superlattice region 5 comprises interleaved semiconductor well and barrier layers indicated as 51 and 53, respectively. Although only four layers are depicted, it is to be understood that more layers will typically be present. The superlattice comprised, in well-known manner, alternating well and barrier layers with the barrier layers having a bandgap greater than the bandgap of the well layers. In one preferred embodiment, the barrier layers have a bandgap which is greater than the bandgaps of layers 3 and 7. It will be readily appreciated that additional layers, for example, a buffer layer, may be present but are not essential for device operation. The superlattice layers can be doped, nominally undoped, or modulation doped. In the latter embodiment, the barrier layers are doped. The first and second layers may have either the same or opposite conductivity types, depending upon the desired mode of operation. The top layer is desirably then to reduce light absorption in that layer. If they have the same conductivity type, the choice, n- or p-type, will depend upon the conductivity characteristics of the carriers in the superlattice.

In one embodiment, the substrate comprised $<100>$n$^+$ InP and an undoped 100 period superlattice, comprising alternating $Al_{0.58}In_{0.52}As$ and $Ga_{0.47}In_{0.53}As$ layers. Each of these interleaved layers was approximately 35 Angstroms thick, and the superlattice was sandwiched between degenerately doped n$^+$, 0.45 $\mu$m thick $Ga_{0.47}In_{0.53}As$ layers. The ohmic contacts were alloyed Au-Sn.

Other materials may be used. For example, $Inp/Ga_{0.47}In_{0.53}As$, $Al_xGa_{1-x}As/GaAs$, and $Hg_{1-x}Cd_xTe/hg_{1-y}Cd_yTe$, $0 \leq x,y \leq 1$ may be used. Sensitivity at wavelengths longer than 10 $\infty$ may thus be obtained. The superlattice layers need not be precisely lattice matched as the use of strained layer superlattices is contemplated.

It is believed that device operation wil be better understood if several exemplary experimental results are discussed first, and then another exemplary embodiment will be discussed. The device was illuminated by a tungsten lamp which was filtered through a monochromator. The optical gain $G_o$ as a function of incident energy was measured for different values of positive applied bias. The gain is defined as $h\gamma I_{ph}/eW$ where $h\gamma$ is the energy of the incident photon, $I_{ph}$ is the photocurrent, is the electron charge, and W is the optical power. It was found that the optical gain was very sensitive to the applied bias and reached a value well in excess of 1,000 at 1.4 volts. The effect of the superlattice quantum states on the photoconductivity was also observed in the spectral response. In particular, there was a step-like increase in the optical gain for energies which corresponded to the onset of absorption in the superlattice. In other words, the optical gain increased when photoexcitation from the heavy hole miniband to the ground-state electron miniband was possible. The onset agreed well with calculated theoretical values.

The responsivity decreased approximately exponentially as a function of temperature within the temperature range from 70 degrees K. to 300 degrees K. Devices were also fabricated with thicker barrier layers, and it was found that the optical gain strongly decreased as the barrier layers became thicker. In particular, the gain had strongly decreased in structures having barrier layers approximately 70 Angstroms thick, and no current gain at all was observed for a barrier layer of thicknesses greater than or equal to 100 Angstroms.

The above results lead one skilled in the art to conclude that the physical mechanisms behind this type of photoconductivity differ from that of classical photoconductivity found in bulk photoconductors. To explain the origin of this type of photoconductivity, the superlattice band structure must first be considered. The wells are coupled to each other because of the small barrier layer thickness and as a result, the quantum states tend to form minibands. The $n^+$ contact regions are, in a preferred embodiment, degenerately doped and the Fermi level lies within the conduction band although close to the bottom of the ground state miniband of the superlattice. Electrons can thus be readily injected into the superlattice due to the high injection efficiency.

However, when an electric field is applied perpendicular to the superlattice layers, carrier transport cannot be described in terms of miniband conduction if the carrier mean free path does not exceed the superlattice period and/or the potential drop across the superlattice period exceeds the miniband width. Transitions between localized well states then enable carrier transport to be described. This situation is depicted schematically in FIG. 2. Several mechanisms can result in localization of the states in the direction perpendicular to the layers. For example, interlayer and intralayer thickness fluctuations can produce fluctuations in the energies of the quasi-eigen states of the wells; compositional fluctuations can produce fluctuations in the superlattice potential profile; and phonon scattering can give rise to collisional broadening. If the total broadening resulting from these effects is either comparable to or greater than the intrinsic miniband widths, the states in the direction perpendicular to the layers become localized in the wells and the mean free path is comparable to the superlattice period.

Figure 2:
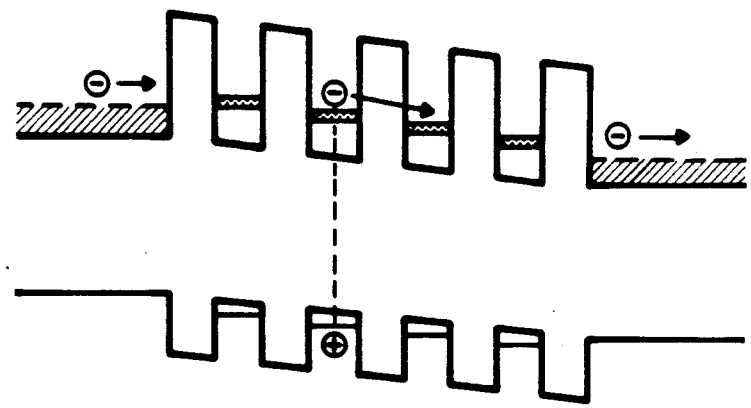
FIGS. 2 and 3 are the energy-band diagrams for an exemplary embodiment of this invention with weak and strong coupling, respectively, between the superlattice wells.

Conduction perpendicular to the superlattice layers then proceeds by phono-assisted tunneling between adjacent wells. This is the so-called hopping conduction which is shown in FIG. 2. In the superlattice described, electrons have a hopping rate which is more than two orders of magnitude greater than that of the heavy holes due to their smaller effective mass. The superlattice thus acts as an effective mass filter as the light, i.e., low effective mass, carriers propagate through the superlattice by tunneling, while the heavy carriers tend to be confined in the wells. Photogenerated holes therefore remain relatively localized as their hopping probability is negligible, as compared to the electrons, while photoelectrons and those injected by the $n^+$ contacts are transported through the superlattice. The effective mass filtering effect produces photoconductive gain which is given by the ratio of the electron lifetime and electron transit time. It will be readily appreciated that the latter increases with barrier layer thickness and is also sensitive to the well thickness.

Figure 3:
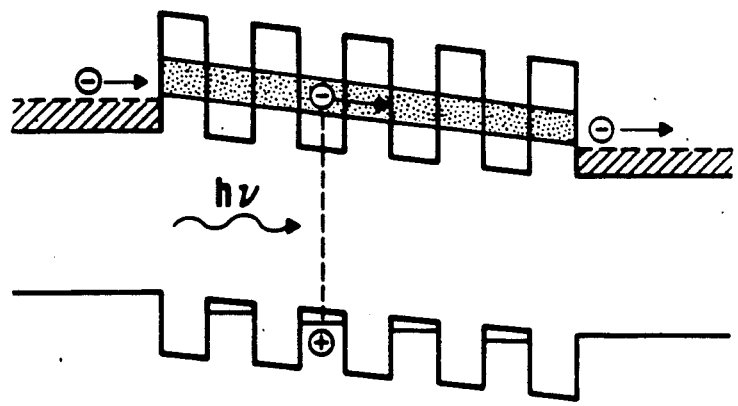

Photoconductive gain can also be obtained in superlattices with very strong coupling between wells. The inhomogeneous broadening due to size and potential fluctuations can be significantly smaller than the miniband width so that the mean free path is appreciably greater than the superlattice period. Transport then occurs by miniband conduction provided that the potential drop across the period is smaller than the miniband width. The ground state electron miniband width is generally much larger than the width of the ground state hole miniband due to the large effective mass difference. If one then applies an electric field so that the potential drop across the superlattice period is greater than the hole miniband width and smaller than the electron miniband width, electrons will be transported by band-type conduction while the holes will be localized in the wells due to their small hopping probability. This condition is depicted schematically in FIG. 3. The advantage of this type of conductivity is that electrons can attain high mobilities if the miniband is sufficiently wide. Shorter transit times and greater bandwidth products may therefore be attained than for the embodiment depicted in FIG. 2.

Gain can also be obtained in a forward biased superlattice. In this case, semiconductor layers 3 and 7 have opposite conductivity types. In addition to observing photocurrent amplification, two other significant effects were observed: (1) the direction of the photocurrent reversed for a forward bias greater than the built-in potential, and (2) a blue shift in the spectral response was observed for voltages greater than the built-in potential. The photocurrent reversal is associated with the center layer having a larger bandgap than those of the two cladding layers, and the high current gain is related to the presence of the superlattice.

Figure 4:
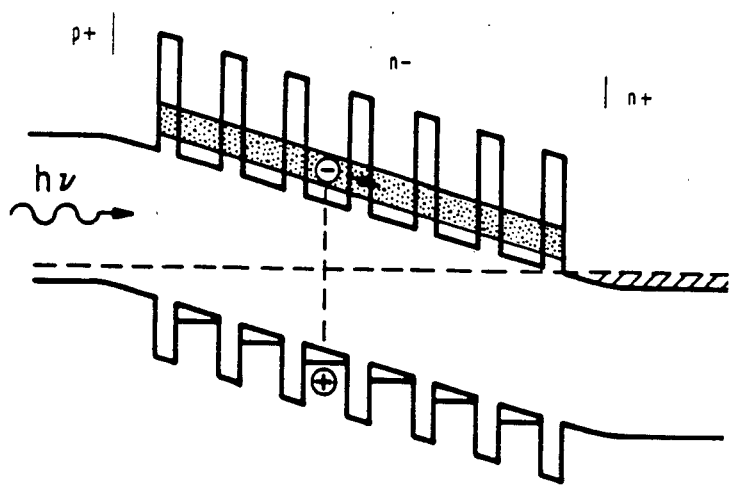
FIGS. 4–6 are the energy-band diagrams for an exemplary superlattice p-n junction device according to this invention under three bias conditions.
Figure 5:
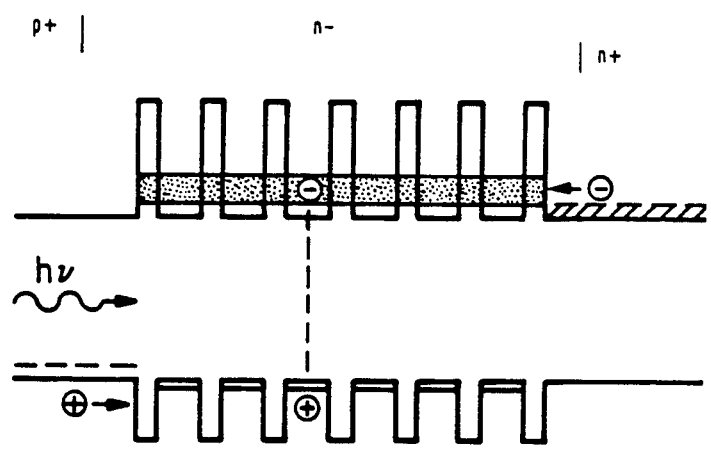
Figure 6:
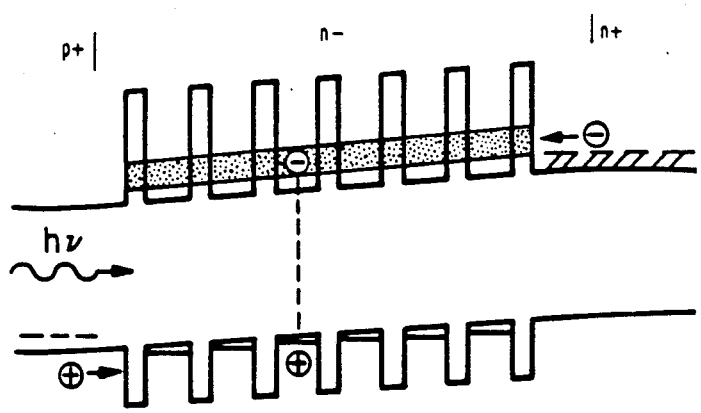

This is better understood by referring to the energy bandgap diagram depicted in FIG. 4. For simplicity, the band bending in the center n-type layer has been omitted. At zero bias, the built-in electric field is responsible for the drift and collection of carriers, and the p-n junction behaves as a conventional photodiode. However, when a forward bias is applied, majority carriers are injected from the $p^+$ and $n^+$ regions and the built-in field is reduced. Both effects enhance the recombination of photogenerated carriers and the collection efficiency, and the resulting responsivity decreases with increasing bias voltage. When the flatband condition is reached as depicted in FIG. 5, there are still relatively large remaining barriers to the injection of both holes and electrons due to the energy band discontinuities at the heterojunctions. These barriers limit the forward dark current to values that are significantly smaller than in the opposite type of heterojunction. This permits application of a voltage greater than the built-in voltage which results in an electric field opposite to that of the original built-in field. The direction of motion of the photocarriers then reverses as depicted in FIG. 6. This explains the change in sign of the photocurrent for biases greater than the built-in potential. It should also be realized that beyond the flatband condition, electrons drift in the same direction as those injected from the contact regions. In other words, the photo current has the same directions as has the dark current so that there can be photoconductive gain.

The shift spectral response is also easily explained. For voltages smaller than the built-in potential, photoexcited minority carriers can reach the superlattice region by diffusion, where they are collected by the electric field giving rise to a low energy shoulder. When the electric field in the superlattice reverses direction, it opposes the collection of the photogenerated minority carriers, and the low energy tail of the spectral response disappears.

Still, other embodiments are contemplated. For example, layers 3 and 7 may both have p-type conductivity if holes, rather than electrons, are to be the primary carriers.

What is claimed:

1. A photoconductive device comprising:
 a superlattice having interleaved well and barrier layers, said superlattice having differential conductivity for electrons and holes, said barrier layers having a first bandgap;
 first and second semiconductor layer disposed on opposite sides of said superlattice, at least one of said layers being heavily doped.

2. A device as recited in claim 1 further comprising electrical contacts to said first and second layers and means for biasing connected to said electrical contacts.

3. A device as recited in claim 2 in which said first and second layers have energy bandgaps less than said first bandgap.

4. A device as recited in claim 3 in which at least one of said first and second layers is degenerately doped.

5. A device as recited in claim 4 in which said first and second semiconductor layers have the same conductivity type.

6. A device as recited in claim 4 in which the first and second semiconductor layers have opposite conductivity types.

* * * * *